(12) United States Patent
Tong et al.

(10) Patent No.: US 11,159,895 B2
(45) Date of Patent: Oct. 26, 2021

(54) PIEZOELECTRIC TYPE AND CAPACITIVE TYPE COMBINED MEMS MICROPHONE

(71) Applicant: AAC ACOUSTIC TECHNOLOGIES (SHENZHEN) CO., LTD., Shenzhen (CN)

(72) Inventors: Bei Tong, Shenzhen (CN); Zhan Zhan, Shenzhen (CN); Yang Li, Shenzhen (CN); Kahkeen Lai, Singapore (SG); Xiaohui Zhong, Singapore (SG); Lian Duan, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/986,302

(22) Filed: Aug. 6, 2020

(65) Prior Publication Data

US 2020/0413203 A1 Dec. 31, 2020

Related U.S. Application Data

(63) Continuation of application No. PCT/CN2019/093948, filed on Jun. 29, 2019.

(51) Int. Cl.
| | |
|---|---|
| *H04R 23/02* | (2006.01) |
| *B81B 3/00* | (2006.01) |
| *H04R 7/06* | (2006.01) |
| *H04R 17/02* | (2006.01) |
| *H04R 19/04* | (2006.01) |

(52) U.S. Cl.
CPC .......... *H04R 23/02* (2013.01); *B81B 3/0021* (2013.01); *H04R 7/06* (2013.01); *H04R 17/02* (2013.01); *H04R 19/04* (2013.01); *B81B 2201/0257* (2013.01); *B81B 2203/0127* (2013.01);

(Continued)

(58) Field of Classification Search
CPC .......... H04R 23/02; H04R 7/06; H04R 17/02; H04R 19/04; H04R 2201/003; H04R 19/005; B81B 3/0021; B81B 2201/0257; B81B 2203/0127; B81B 2203/0315; B81B 2203/04

See application file for complete search history.

(56) References Cited

U.S. PATENT DOCUMENTS

| | | | |
|---|---|---|---|
| 2016/0219378 A1* | 7/2016 | Hall | H04R 19/04 |
| 2017/0265009 A1* | 9/2017 | Sridharan | H04R 17/02 |
| 2018/0132023 A1* | 5/2018 | Yoo | H04R 1/04 |

* cited by examiner

*Primary Examiner* — Matthew A Eason
(74) *Attorney, Agent, or Firm* — W&G Law Group (57) ABSTRACT

Provided is a piezoelectric type and capacitive type combined MEMS microphone, comprising a base with a back cavity and a capacitor system arranged on the base; wherein, the capacitor system comprises a back plate and a diaphragm; the back plate is opposite to and apart from the diaphragm to form a first sound cavity; a piezoelectric diaphragm structure is between the capacitor system and the base; a second sound cavity is formed between the capacitor system and the piezoelectric diaphragm structure; the second sound cavity is at least in communication with the first sound cavity or the back cavity; the piezoelectric type and capacitive type combined MEMS microphone can output two groups of electric signals comprising a group of electric signals output from the capacitor system and a group of electric signals output from the piezoelectric diaphragm structure, thus improving sensitivity of the microphone.

20 Claims, 6 Drawing Sheets

(52) U.S. Cl.
  CPC ... *B81B 2203/0315* (2013.01); *B81B 2203/04* (2013.01); *H04R 2201/003* (2013.01)

PIEZOELECTRIC TYPE AND CAPACITIVE TYPE COMBINED MEMS MICROPHONE

TECHNICAL FIELD

The present disclosure relates to the field of acoustoelectric converting apparatuses, and particularly, to a piezoelectric type and capacitive type combined MEMS microphone.

BACKGROUND

A Micro-Electro-Mechanical System (MEMS) microphone is an electro-acoustic transducer fabricated by using a micro-machining technology, which has characteristics such as small size, good frequency response and low noise. With the development of small and thin electronic devices, MEMS microphones are more and more widely used in these devices.

The MEMS microphone in the related art includes a silicon substrate and a parallel plate capacitor composed of a diaphragm and a back plate; the diaphragm and the back plate are oppositely arranged and spaced apart at a certain distance. The diaphragm vibrates under an action of a sound wave, causing the distance between the diaphragm and the back plate to change, and causing capacitance of the plate capacitor to change, thereby converting a sound wave signal into an electric signal. At present, the capacitive type MEMS microphone seems to have reached a performance bottleneck, and there has been no considerable improvement in recent years; in addition, the performance of such type of MEMS microphone is greatly affected by dust, water and pollutants; and when the diaphragm is working at a high sound pressure environment, reliability will be getting worse. In addition, a fabrication process is also relatively complex, and a production cost is relatively high.

Therefore, it is necessary to provide a new MEMS microphone to solve the above-described problems.

SUMMARY

An objective of the present disclosure is to provide a high-sensitivity piezoelectric type and capacitive type combined MEMS microphone.

Technical solutions of the present disclosure are as follows:

A new MEMS microphone comprises a base with a back cavity and a capacitor system arranged on the base; the capacitor system comprises a back plate and a diaphragm; and the back plate is opposite to and spaced apart from the diaphragm to form a first sound cavity; wherein, a piezoelectric diaphragm structure is further arranged between the capacitor system and the base; a second sound cavity is formed between the capacitor system and the piezoelectric diaphragm structure; and the second sound cavity is at least in communication with the first sound cavity or the back cavity.

As an improvement, the first sound cavity, the second sound cavity and the back cavity are in communication; a first acoustic hole communicating the first sound cavity and the second sound cavity is formed in the capacitor system; and a second acoustic hole communicating the second sound cavity and the back cavity is formed through the piezoelectric diaphragm structure.

As an improvement, the piezoelectric diaphragm structure comprises a first electrode sheet, a piezoelectric diaphragm, and a second electrode sheet that are sequentially stacked; the first electrode sheet is provided on a side of the piezoelectric diaphragm that faces the capacitor system; and the second electrode sheet is provided on a side of the piezoelectric diaphragm that faces the base.

As an improvement, a center of the first electrode sheet, a center of the piezoelectric diaphragm, and a center of the second electrode sheet are all on a same vertical line; an area of the first electrode sheet is smaller than an area of the piezoelectric diaphragm; the second acoustic hole is formed through the piezoelectric diaphragm and the second electrode sheet; and the second acoustic hole is around an outer circumferential side of the first electrode sheet.

As an improvement, the first electrode sheet has a circular shape or a square shape.

As an improvement, a center of the first electrode sheet, a center of the piezoelectric diaphragm, and a center of the second electrode sheet are all on a same vertical line; the second acoustic hole is formed through the piezoelectric diaphragm and the second electrode sheet; and the second acoustic hole is provided at an inner circumferential side of the first electrode sheet.

As an improvement, the first electrode sheet has a circular ring shape, or a hollow rectangular shape.

As an improvement, a center of the first electrode sheet, a center of the piezoelectric diaphragm, and a center of the second electrode sheet are all on a same vertical line; the second acoustic hole is formed through the piezoelectric diaphragm and the second electrode sheet; the first electrode sheet comprises at least two electrode bodies; a slit is formed between two adjacent electrode bodies; the slit is in communication with the second acoustic hole; and two or more of the above-described electrode bodies form a circle or a square.

As an improvement, the piezoelectric diaphragm structure further comprises a first electrode line and a first electrode terminal; and the first electrode sheet is connected with the first electrode terminal through the first electrode line.

As an improvement, the piezoelectric diaphragm structure further comprises an insulating base layer; the second electrode sheet is provided on the insulating base layer; and a shape of the insulating base layer is the same as a shape of the second electrode sheet.

As an improvement, a first insulating layer is provided between the piezoelectric diaphragm structure and the base; the first insulating layer is connected with the piezoelectric diaphragm structure or the base; a second insulating layer is provided between the capacitor system and the piezoelectric diaphragm structure; the second insulating layer is connected with the capacitor system or the piezoelectric diaphragm structure; a third insulating layer is provided between the diaphragm and the back plate; and the third insulating layer is connected with the diaphragm or the back plate.

Advantageous effects of the present disclosure are that:

Compared with the existed art, the piezoelectric type and capacitive type combined MEMS microphone according to the present disclosure has the piezoelectric diaphragm structure coupled to the capacitive type MEMS microphone, therefore, the microphone transforms a sound wave signal into an electric signal under a cooperation of the diaphragm and the back plate, and besides, sound pressure acts on the piezoelectric diaphragm structure to deform the piezoelectric diaphragm structure, thereby generating charge output. That is, the piezoelectric type and capacitive type combined MEMS microphone according to the present disclosure can output two groups of electric signals including a group of electric signals output from the capacitor system and a group of electric signals output from the piezoelectric diaphragm structure, which, thus, can improve sensitivity of the microphone. In addition, arrangement of the piezoelectric diaphragm structure also plays a dustproof role to a certain extent.

DETAILED DESCRIPTION

In order to make objects, technical solutions and advantages of the present disclosure more apparent, the present disclosure will be further explained in detail below in conjunction with the drawings and the embodiments. It should be understood that the specific embodiments described here are merely used for explaining the present disclosure, and not intended to limit the present disclosure. Based on the embodiments described herein, those ordinarily skilled in the art can obtain other embodiment(s), without any inventive work, which should all be within the scope of the present disclosure.

The terms "first", "second", "third", "fourth", and the like in the description and in the claims as well as in the above accompanying drawings of the present disclosure, if any, are used for distinguishing between similar objects, and not necessarily for describing a particular sequential or chronological order. It should be understood that, the terms so used are interchangeable under appropriate circumstances such that the embodiments described herein are, for example, capable of operation in sequences other than those illustrated or described herein. Furthermore, the terms "include," and "have," and any variations thereof, are intended to cover a non-exclusive inclusion, for example, processes, methods, systems, products or devices that comprise a list of steps or units are not necessarily limited to those steps or units expressly listed, but may include other steps or units not expressly listed or inherent to these processes, methods, products or devices.

It should be noted that, terms like "first" and "second" are merely provided for the purpose of description other than indicating or implying their relative importance or implicitly denoting the number of technical features indicated thereby. Thus, features with "first" or "second" defined may include at least one of the features either explicitly or implicitly. In addition, the technical solutions between the respective embodiments can be combined with each other, but they shall be based on ability of those skilled in the art to implement; when the combination of technical solutions conflict with each other or cannot be implemented, it should be considered that such combination of technical solutions neither exist, nor fall within the protection scope of the present disclosure.

First Embodiment

Figure 1:
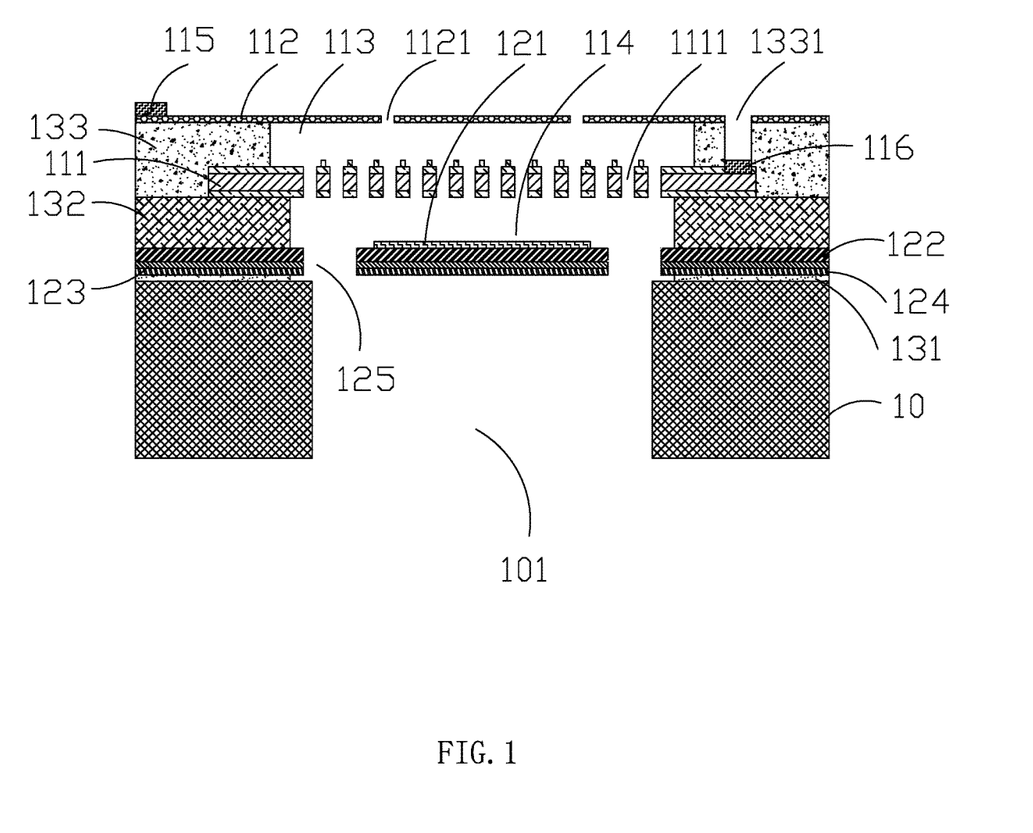
FIG. 1 is a cross-sectional view of a piezoelectric type and capacitive type combined MEMS microphone according to a first embodiment of the present disclosure.
Figure 2:
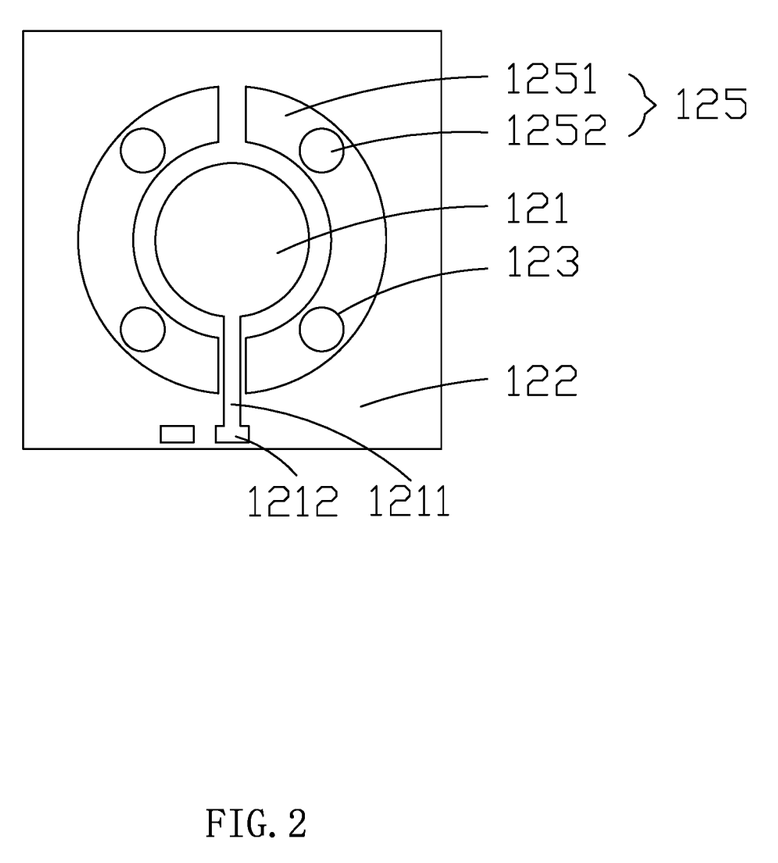
FIG. 2 is a top view of a piezoelectric diaphragm structure of the piezoelectric type and capacitive type combined MEMS microphone according to the first embodiment of the present disclosure.

Referring to FIG. 1 and FIG. 2, this embodiment provides a piezoelectric type and capacitive type combined MEMS microphone 1, including a base 10, and a capacitor system arranged on the base 10 and insulated from the base 10. A piezoelectric diaphragm structure 12 is further provided between the capacitor system and the base 10. A first insulating layer 131 is provided between the piezoelectric diaphragm structure 12 and the base, and a second insulating layer 132 is provided between the capacitor system and the piezoelectric diaphragm structure 12.

The base 10 is made of a semiconductor material and has a back cavity 101, an upper surface, and a lower surface opposite to the upper surface. The back cavity 101 penetrates through the upper surface and the lower surface, wherein, the back cavity 101 may be formed by a bulk silicon micromachining process or etching. The capacitor system is provided on the piezoelectric diaphragm structure 12 through the second insulating layer 132. The capacitor system includes a back plate 111, a diaphragm 112 provided opposite to and spaced apart from the back plate 111, and a third insulating layer 133 located between the back plate 111 and the diaphragm 112. The back plate 111 and the diaphragm 112 are spaced apart to form a first sound cavity 113, the capacitor system and the piezoelectric diaphragm structure 12 are spaced apart to form a second sound cavity 114, the first sound cavity 113 runs through the third insulating layer 133, and the second sound cavity 114 runs through the second insulating layer 132. A surface of the back plate 111 that faces the first sound cavity 113 is further provided with a plurality of insulating protrusions for preventing electrical conduction between the back plate 111 and the diaphragm 112. Both the back plate 111 and the diaphragm 112 are conductors, and are made of a polycrystalline silicon-doped or monocrystalline silicon-doped conductive material. In a power-on working state of the MEMS microphone, the back plate 111 and the diaphragm 112 carry charges with opposite polarities, forming the capacitor system. When the diaphragm 112 vibrates under an action of a sound wave, a distance between the diaphragm 112 and the back plate 111 is changed, causing capacitance of the capacitor system to change, thereby converting a sound wave signal into an electric signal to implement a corresponding function of the microphone.

It should be noted that, positions of the back plate 111 and the diaphragm 112 may be adjusted, as long as the back plate 111 and the diaphragm 112 can form the capacitor system, that is, the back plate 111 may be located between the diaphragm 112 and the base 10, or the diaphragm 112 may be located between the back plate 111 and the base 10.

In this embodiment, the back plate 111 is located between the diaphragm 112 and the base 10. The second insulating layer 132 is provided between the back plate 111 and the piezoelectric diaphragm structure 12. A first acoustic hole 1111 communicating the first sound cavity 113 and the second sound cavity 114 is formed through the back plate 111. A diaphragm electrode 115 connected with the diaphragm is provided on the diaphragm 112. A connection hole 1331 is formed through the third insulating layer 133; and a back plate electrode 116 connected with the back plate 111 is arranged in the connection hole 1331. The second insulating layer 132 is connected with the back plate 111 or the piezoelectric diaphragm structure 12, and the second insulating layer 132 can not only support the back plate, but also ensure insulation between the back plate 111 and the piezoelectric diaphragm structure 12. The third insulating layer 133 can not only support the diaphragm 112, but also ensure insulation between the diaphragm 112 and the back plate 111. The first insulating layer 131, the second insulating layer 132 and the third insulating layer 133 are made of a semiconductor silicon oxide insulating layer material.

It should be noted that, in other embodiments, the back plate 111 may not have the first acoustic hole 1111, that is to say, the first sound cavity 113 and the second sound cavity 114 may not be in communication. And the piezoelectric diaphragm structure 12 may not have a second acoustic hole 125. This is because the piezoelectric type and capacitive type combined MEMS microphone 1 may be mounted in different manners, and sound may propagate to the diaphragm 112 and the piezoelectric diaphragm structure 12 in different directions. In application, it may only require sound to reach the diaphragm 112 and the piezoelectric diaphragm structure 12, thus the first acoustic hole 1111 and the second acoustic hole 125 may be provided as needed.

Further, a through hole 1121 is formed through the diaphragm 112, so that when the diaphragm 112 vibrates, air flow generated between the diaphragm 112 and the back plate 111 is more easily discharged, thereby reducing noise of the microphone and improving a signal-to-noise ratio.

It should be noted that, the through hole 1121 through the diaphragm 112 may have other functions. For example, when sound does not propagate in a direction from the back cavity 101 toward the capacitor system, but propagates in a direction from the capacitor system toward the back cavity 101, the through hole 1121 through the diaphragm 112 allows the sound to reach the diaphragm 112 and the piezoelectric diaphragm structure 12.

The piezoelectric diaphragm structure 12 has a middle-curved structure, and comprises a first electrode sheet 121, a piezoelectric diaphragm 122, and a second electrode sheet 123 sequentially stacked, and further comprises a first electrode line 1211 and a first electrode terminal 1212. A center of the electrode sheet 121, a center of the piezoelectric diaphragm 122 and a center of the second electrode sheet 123 are all on a same vertical line. The first electrode sheet 121 is laminated on a side of the piezoelectric diaphragm 122 that faces the back plate 111, the first electrode sheet 121 is connected to the first electrode terminal 1212 through the first electrode line 1211, and an area of the first electrode sheet 121 is smaller than an area of the piezoelectric diaphragm 122. The second electrode sheet 123 is laminated on a side of the piezoelectric diaphragm 122 that faces the base 10. Both ends (i.e., marginal portions) of the second electrode sheet 123 and the piezoelectric diaphragm 122 are provided between the base 10 and the second insulating layer 132, which serve as fixed ends, and middle portions of the second electrode sheet 123 and the piezoelectric diaphragm 122 serve as reaction regions. The first electrode sheet 121 is laminated on the reaction region of the piezoelectric diaphragm 122. The second acoustic holes 125 communicating the second sound cavity 114 and the back cavity 101 are formed through the piezoelectric diaphragm 122 and the second electrode sheet 123 respectively between the fixed end and a free end, the second acoustic holes 125 are evenly distributed with the center of the piezoelectric diaphragm 122 as a circle center, and the second acoustic holes 125 enclose an outer circumferential side of the first electrode sheet 121. In this embodiment, a second acoustic hole 125 includes an arc-shaped groove 1251 through the piezoelectric diaphragm 122 and a round hole 1252 through the second electrode sheet 123, the arc-shaped groove 1251 and the round hole 1252 are in communication with each other, and an area of the arc-shaped groove 1251 is larger than an area of the round hole 1252. There are two arc-shaped grooves 1251 arranged symmetrically, and four round holes 1252 provided. The second acoustic holes 125 serve to communicate the second sound cavity 114 with the back cavity 101; and the number and positions of the second acoustic holes 125 are reasonably arranged, which can also play a dustproof role, and prevent dust from entering the second sound cavity 114 and the first sound cavity 113 as much as possible.

Optionally, the first electrode sheet 121 has a circular shape or a square shape; of course, the shape of the first electrode sheet 121 is not limited to a circle or a square. In addition, the shapes of the piezoelectric diaphragm 122 and the second electrode sheet 123 are not limited.

When the microphone is working, sound pressure acts on the piezoelectric diaphragm structure 12, causing the piezoelectric diaphragm 122 to deform, thereby generating charge output, that is, the piezoelectric type and capacitive type combined MEMS microphone 1 according to this embodiment can output two groups of electric signals, including a group of electric signals output from the capacitor system and a group of electric signals output from the piezoelectric diaphragm structure 12, which, thus, can improve sensitivity of the microphone.

Further, the piezoelectric diaphragm structure 12 further includes an insulating base layer 124 provided on the base 10 through the first insulating layer 131, the second electrode sheet 123 is provided on the insulating base layer 124, and a shape of the insulating base layer 124 is the same as the shape of the second electrode sheet 123. The insulating base layer 124 is made of a material such as monocrystalline silicon, polycrystalline silicon or silicon nitride, and plays a protective role; and the first insulating layer 131 plays a role of supporting the insulating base layer 124.

Second Embodiment

Figure 3:
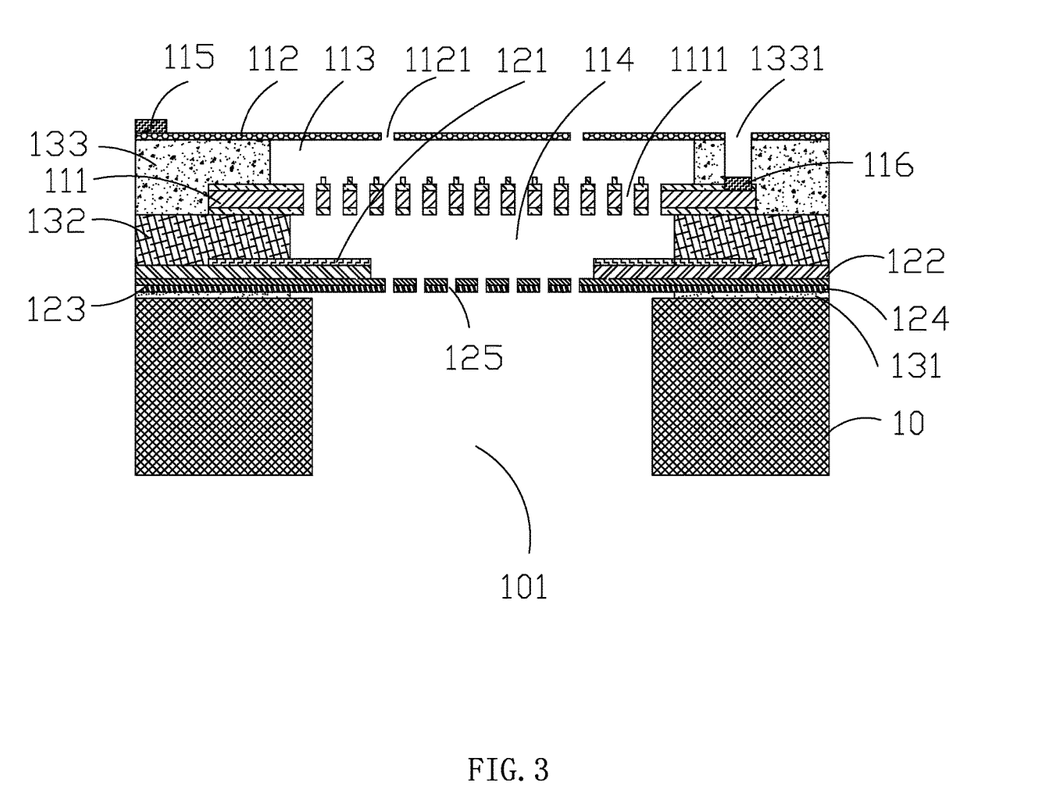
FIG. 3 is a cross-sectional view of a piezoelectric type and capacitive type combined MEMS microphone according to a second embodiment of the present disclosure.
Figure 4:
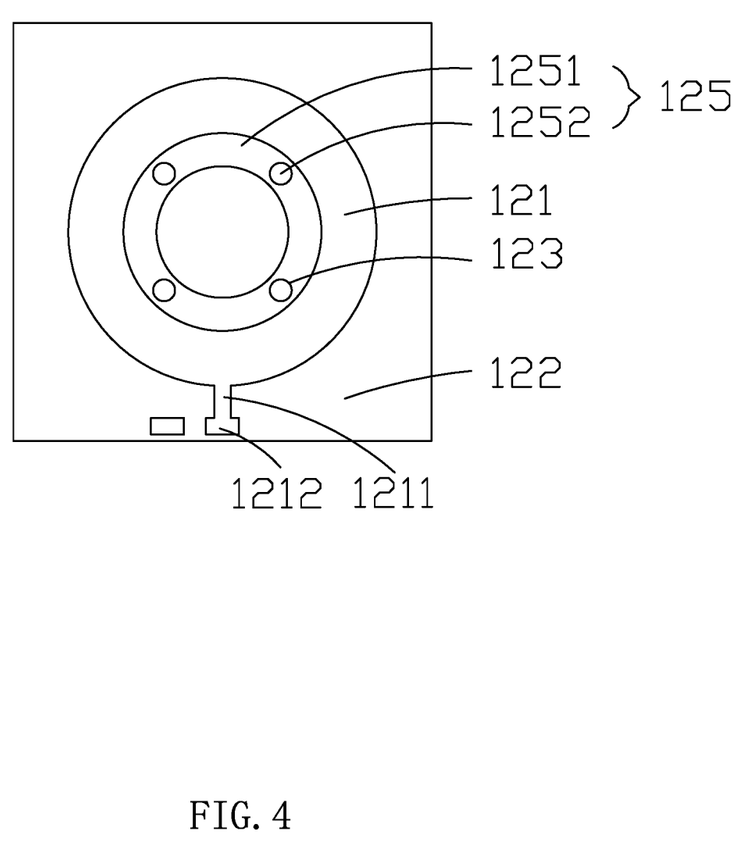
FIG. 4 is a top view of a piezoelectric diaphragm structure of the piezoelectric type and capacitive type combined MEMS microphone according to the second embodiment of the present disclosure.

Referring to FIG. 3 and FIG. 4, this embodiment differs from the first embodiment in a piezoelectric diaphragm structure 12, and the piezoelectric diaphragm structure 12 according to this embodiment has an edge-curved structure. The piezoelectric diaphragm structure 12 comprises a first electrode sheet 121, a piezoelectric diaphragm 122, and a second electrode sheet 123 sequentially stacked, and further comprises a first electrode line 1211 and a first electrode terminal 1212. A center of the first electrode sheet 121, a center of the piezoelectric diaphragm 122 and a center of the second electrode sheet 123 are all on a same vertical line. The first electrode sheet 121 is laminated on a side of the piezoelectric diaphragm 122 that faces a back plate 111, and the first electrode sheet 121 is connected to the first electrode terminal 1212 through the first electrode line 1211. The second electrode sheet 123 is laminated on a side of the piezoelectric diaphragm 122 that faces the base 10. Both ends (marginal portions) of the piezoelectric diaphragm 122 and the second electrode sheet 123 are provided between the first insulating layer 131 and the second insulating layer 132, which serve as fixed ends. A second acoustic hole 125 communicating the second sound cavity 114 and the back cavity 101 is formed through a middle portion of the piezoelectric diaphragm 122 and the second electrode sheet 123. The second acoustic hole 125 includes a large round hole 1251 running through the piezoelectric diaphragm 122 and a small round hole 1252 running through the second electrode sheet 123, and the large round hole 1251 and the small round hole 1252 are in communication with each other. A region from an inner wall to the fixed end of the piezoelectric diaphragm 122 serves as a reaction region, and the first electrode sheet 121 is laminated on the reaction region of the piezoelectric diaphragm 122. Both the large round hole 1251 and the small round hole 1252 are provided at an inner circumferential side of the first electrode sheet 121. The large round holes 1251 are evenly arranged with a center of the piezoelectric diaphragm 122 as a circle center. There are four small round holes 1252 evenly arranged with the center of the piezoelectric diaphragm 122 as a circle center. And a total area of the small round holes 1252 is much smaller than an area of the large round hole 1251, thus the second electrode sheet 123 can also play a dustproof role, and prevent dust from entering the second sound cavity 114 and a first sound cavity 113.

Optionally, the first electrode sheet 121 has a circular ring shape, or a hollow rectangular shape; and of course, the shape of the first electrode sheet 121 is not limited thereto. In addition, the shapes of the piezoelectric diaphragm 122 and the second electrode sheet 123 are not limited.

When the microphone is working, sound pressure acts on the piezoelectric diaphragm structure 12, causing the piezoelectric diaphragm 122 to deform, thereby generating charge output, that is, the piezoelectric type and capacitive type combined MEMS microphone 1 according to this embodiment can output two groups of electric signals, including a group of electric signals output from the capacitor system and a group of electric signals output from the piezoelectric diaphragm structure 12, which, thus, can improve sensitivity of the microphone.

Further, the piezoelectric diaphragm structure 12 further includes an insulating base layer 124 provided on the base 10 through the first insulating layer 131, the second electrode sheet 123 is provided on the insulating base layer 124, and a shape of the insulating base layer 124 is the same as the shape of the second electrode sheet 123. The insulating base layer 124 is made of a material such as monocrystalline silicon, polycrystalline silicon or silicon nitride, and plays a protective role; and the first insulating layer 131 plays a role of supporting the insulating base layer 124.

Third Embodiment

Figure 5:
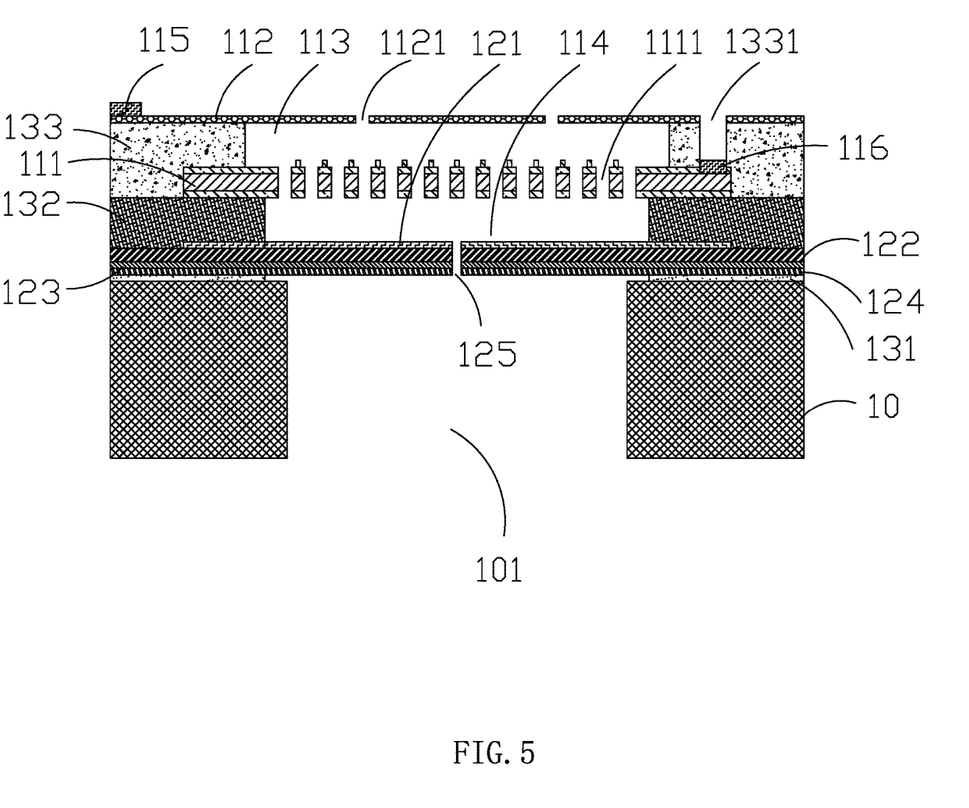
FIG. 5 is a cross-sectional view of a piezoelectric type and capacitive type combined MEMS microphone according to a third embodiment of the present disclosure.
Figure 6:
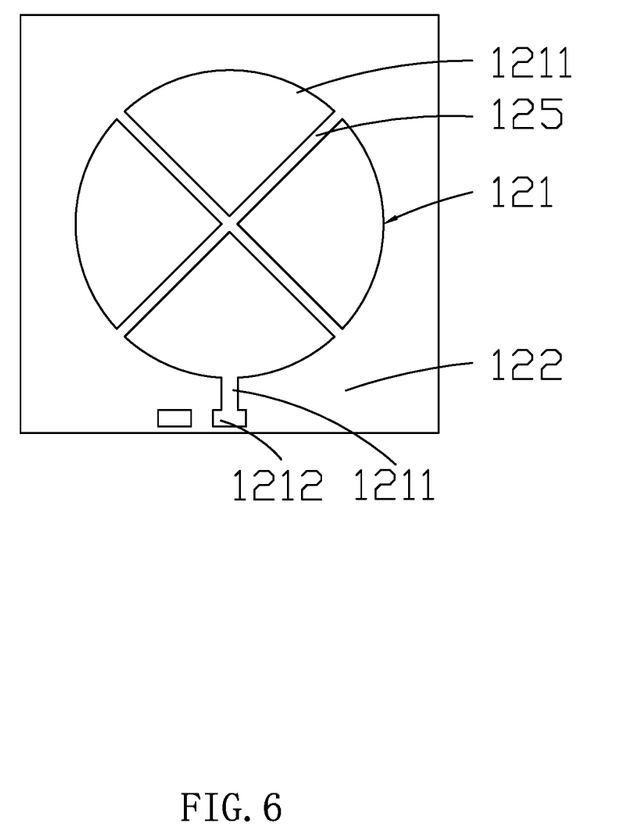
FIG. 6 is a top view of a piezoelectric diaphragm structure of the piezoelectric type and capacitive type combined MEMS microphone according to the third embodiment of the present disclosure.

Referring to FIG. 5 and FIG. 6, this embodiment differs from the first embodiment in a piezoelectric diaphragm structure 12, and the piezoelectric diaphragm structure 12 according to this embodiment has a four-cantilever beam structure. The piezoelectric diaphragm structure 12 comprises a first electrode sheet 121, a piezoelectric diaphragm 122, and a second electrode sheet 123 sequentially stacked, and further comprises a first electrode line 1211 and a first electrode terminal 1212. A center of the first electrode sheet 121, a center of the piezoelectric diaphragm 122 and a center of the second electrode sheet 123 are all on a same vertical line. The first electrode sheet 121 is laminated on a side of the piezoelectric diaphragm 122 that faces a back plate 111, and the first electrode sheet 121 is connected to the first electrode terminal 1212 through the first electrode line 1211. The second electrode sheet 123 is laminated on a side of the piezoelectric diaphragm 122 that faces the base 10. A second acoustic hole 125 communicating a second sound cavity 114 with a back cavity 101 is formed correspondingly through the piezoelectric diaphragm 122 and the second electrode sheet 123. In this embodiment, the first electrode sheet 121 with a split structure includes four electrode bodies 1211. A slit is formed between two adjacent electrode bodies 1211, the slit is in communication with the second acoustic hole 125, and a shape of the slit is the same as a shape of the second acoustic hole 125. And sizes and shapes of the four electrode bodies 1211 may be the same or different, that is, the first electrode sheet 121 may have a symmetric structure or an asymmetric structure. In this embodiment, the four electrode bodies 1213 all have a same size and shape with a symmetric structure and the four electrode bodies 1213 cooperatively enclose a circular structure. In other embodiments, the four electrode bodies 1211 cooperatively enclose a square structure. Of course, the electrode bodies 1211 are not limited to cooperatively enclose a circular structure or a square structure, and a size and a shape of each electrode body 1211 may be set according to actual needs. In addition, the shapes of the piezoelectric diaphragm 122 and the second electrode sheet 123 are not limited.

When the microphone is working, sound pressure acts on the piezoelectric diaphragm structure 12, causing the piezoelectric diaphragm 122 to deform, thereby generating charge output, that is, the piezoelectric type and capacitive type combined MEMS microphone 1 according to this embodiment can output two groups of electric signals, including a group of electric signals output from the capacitor system and a group of electric signals output from the piezoelectric diaphragm structure 12, which, thus, can improve sensitivity of the microphone.

Further, the piezoelectric diaphragm structure 121 further includes an insulating base layer 124 provided on the base 10 through the first insulating layer 131, the second electrode sheet 123 is provided on the insulating base layer 124, and a shape of the insulating base layer 124 is the same as the shape of the second electrode sheet 123. The insulating base layer 124 is made of a material such as monocrystalline silicon, polycrystalline silicon or silicon nitride, and plays a protective role; and the first insulating layer 131 plays a role of supporting the insulating base layer 124.

The above are only the embodiments of the present disclosure; it should be noted here that, those ordinarily skilled in the art can also make improvements without departing from the inventive concept of the present disclosure, and these improvements all belong to the scope of the present disclosure.

What is claimed is:

1. A piezoelectric type and capacitive type combined MEMS microphone, comprising a base with a back cavity, and a capacitor system arranged on the base;
   wherein, the capacitor system comprises a back plate and a diaphragm, the back plate is opposite to and spaced apart from the diaphragm to form a first sound cavity;
   wherein, a piezoelectric diaphragm structure is further arranged between the capacitor system and the base; a second sound cavity is formed between the capacitor system and the piezoelectric diaphragm structure, and the second sound cavity is at least in communication with the first sound cavity or the back cavity.

2. The piezoelectric type and capacitive type combined MEMS microphone according to claim 1, wherein, the first sound cavity, the second sound cavity and the back cavity are in communication;
   a first acoustic hole communicating the first sound cavity and the second sound cavity is formed in the capacitor system; and a second acoustic hole communicating the second sound cavity and the back cavity is formed through the piezoelectric diaphragm structure.

3. The piezoelectric type and capacitive type combined MEMS microphone according to claim 2, wherein, the piezoelectric diaphragm structure comprises a first electrode sheet, a piezoelectric diaphragm, and a second electrode sheet that are sequentially stacked;
the first electrode sheet is provided on a side of the piezoelectric diaphragm that faces the capacitor system; and the second electrode sheet is provided on a side of the piezoelectric diaphragm that faces the base.

4. The piezoelectric type and capacitive type combined MEMS microphone according to claim 3, wherein, a center of the first electrode sheet, a center of the piezoelectric diaphragm, and a center of the second electrode sheet are all on a same vertical line;
an area of the first electrode sheet is smaller than an area of the piezoelectric diaphragm;
the second acoustic hole is formed through the piezoelectric diaphragm and the second electrode sheet, and the second acoustic hole is around an outer circumferential side of the first electrode sheet.

5. The piezoelectric type and capacitive type combined MEMS microphone according to claim 4, wherein, the first electrode sheet has a circular shape or a square shape.

6. The piezoelectric type and capacitive type combined MEMS microphone according to claim 3, wherein, a center of the first electrode sheet, a center of the piezoelectric diaphragm, and a center of the second electrode sheet are all on a same vertical line;
the second acoustic hole is formed through the piezoelectric diaphragm and the second electrode sheet, and the second acoustic hole is provided at an inner circumferential side of the first electrode sheet.

7. The piezoelectric type and capacitive type combined MEMS microphone according to claim 6, wherein, the first electrode sheet has a circular ring shape, or a hollow rectangular shape.

8. The piezoelectric type and capacitive type combined MEMS microphone according to claim 3, wherein, a center of the first electrode sheet, a center of the piezoelectric diaphragm, and a center of the second electrode sheet are all on a same vertical line;
the second acoustic hole is formed through the piezoelectric diaphragm and the second electrode sheet;
the first electrode sheet comprises at least two electrode bodies;
a slit is formed between two adjacent electrode bodies, and the slit is in communication with the second acoustic hole;
two or more of the electrode bodies form a circle or a square.

9. The piezoelectric type and capacitive type combined MEMS microphone according to claim 3, wherein, the piezoelectric diaphragm structure further comprises a first electrode line and a first electrode terminal, and the first electrode sheet is connected to the first electrode terminal through the first electrode line.

10. The piezoelectric type and capacitive type combined MEMS microphone according to claim 4, wherein, the piezoelectric diaphragm structure further comprises a first electrode line and a first electrode terminal, and the first electrode sheet is connected to the first electrode terminal through the first electrode line.

11. The piezoelectric type and capacitive type combined MEMS microphone according to claim 6, wherein, the piezoelectric diaphragm structure further comprises a first electrode line and a first electrode terminal, and the first electrode sheet is connected to the first electrode terminal through the first electrode line.

12. The piezoelectric type and capacitive type combined MEMS microphone according to claim 8, wherein, the piezoelectric diaphragm structure further comprises a first electrode line and a first electrode terminal, and the first electrode sheet is connected to the first electrode terminal through the first electrode line.

13. The piezoelectric type and capacitive type combined MEMS microphone according to claim 3, wherein, the piezoelectric diaphragm structure further comprises an insulating base layer, the second electrode sheet is provided on the insulating base layer, and a shape of the insulating base layer is the same as a shape of the second electrode sheet.

14. The piezoelectric type and capacitive type combined MEMS microphone according to claim 4, wherein, the piezoelectric diaphragm structure further comprises an insulating base layer, the second electrode sheet is provided on the insulating base layer, and a shape of the insulating base layer is the same as a shape of the second electrode sheet.

15. The piezoelectric type and capacitive type combined MEMS microphone according to claim 6, wherein, the piezoelectric diaphragm structure further comprises an insulating base layer, the second electrode sheet is provided on the insulating base layer, and a shape of the insulating base layer is the same as a shape of the second electrode sheet.

16. The piezoelectric type and capacitive type combined MEMS microphone according to claim 8, wherein, the piezoelectric diaphragm structure further comprises an insulating base layer, the second electrode sheet is provided on the insulating base layer, and a shape of the insulating base layer is the same as a shape of the second electrode sheet.

17. The piezoelectric type and capacitive type combined MEMS microphone according to claim 2, wherein, a first insulating layer is provided between the piezoelectric diaphragm structure and the base; the first insulating layer is connected with the piezoelectric diaphragm structure or the base;
a second insulating layer is provided between the capacitor system and the piezoelectric diaphragm structure; the second insulating layer is connected with the capacitor system or the piezoelectric diaphragm structure;
a third insulating layer is provided between the diaphragm and the back plate; the third insulating layer is connected with the diaphragm or the back plate.

18. The piezoelectric type and capacitive type combined MEMS microphone according to claim 3, wherein, a first insulating layer is provided between the piezoelectric diaphragm structure and the base; the first insulating layer is connected with the piezoelectric diaphragm structure or the base;
a second insulating layer is provided between the capacitor system and the piezoelectric diaphragm structure; the second insulating layer is connected with the capacitor system or the piezoelectric diaphragm structure;
a third insulating layer is provided between the diaphragm and the back plate; the third insulating layer is connected with the diaphragm or the back plate.

19. The piezoelectric type and capacitive type combined MEMS microphone according to claim 4, wherein, a first insulating layer is provided between the piezoelectric diaphragm structure and the base; the first insulating layer is connected with the piezoelectric diaphragm structure or the base;

a second insulating layer is provided between the capacitor system and the piezoelectric diaphragm structure; the second insulating layer is connected with the capacitor system or the piezoelectric diaphragm structure;

a third insulating layer is provided between the diaphragm and the back plate; the third insulating layer is connected with the diaphragm or the back plate.

20. The piezoelectric type and capacitive type combined MEMS microphone according to claim 6, wherein, a first insulating layer is provided between the piezoelectric diaphragm structure and the base; the first insulating layer is connected with the piezoelectric diaphragm structure or the base;

a second insulating layer is provided between the capacitor system and the piezoelectric diaphragm structure; the second insulating layer is connected with the capacitor system or the piezoelectric diaphragm structure;

a third insulating layer is provided between the diaphragm and the back plate; the third insulating layer is connected with the diaphragm or the back plate.

* * * * *